United States Patent
Hong (10) Patent No.: US 9,443,742 B2
(45) Date of Patent: Sep. 13, 2016

(54) PATTERNED FEATURE AND MULTIPLE PATTERNING METHOD THEREOF

(71) Applicant: Semiconductor Manufacturing International (Shanghai) Corporation, Shanghai (CN)

(72) Inventor: Zhongshan Hong, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/797,130

(22) Filed: Jul. 12, 2015

(65) Prior Publication Data
US 2016/0027659 A1    Jan. 28, 2016

(30) Foreign Application Priority Data
Jul. 28, 2014    (CN) .......................... 2014 1 0363413

(51) Int. Cl.
*H01L 29/40* (2006.01)
*H01L 21/311* (2006.01)
*H01L 21/033* (2006.01)
*H01L 21/02* (2006.01)

(52) U.S. Cl.
CPC ..... *H01L 21/31144* (2013.01); *H01L 21/0217* (2013.01); *H01L 21/0228* (2013.01); *H01L 21/02115* (2013.01); *H01L 21/02123* (2013.01); *H01L 21/02126* (2013.01); *H01L 21/02164* (2013.01); *H01L 21/02167* (2013.01); *H01L 21/0332* (2013.01); *H01L 21/0337* (2013.01)

(58) Field of Classification Search
CPC .................... H01L 21/76811; H01L 45/1691; H01L 2224/03466; H01L 22/00
See application file for complete search history.

(56) References Cited

U.S. PATENT DOCUMENTS

2015/0214064 A1*  7/2015  Pritchard ............ H01L 21/3088 438/585

* cited by examiner

*Primary Examiner* — Elias M Ullah
(74) *Attorney, Agent, or Firm* — Anova Law Group, PLLC (57) ABSTRACT

A multiple patterning method is provided. The multiple patterning method includes providing a substrate; and forming a sacrificial film on the substrate. The multiple patterning method also includes forming a first mask film on the sacrificial film; and forming a second mask film for subsequently forming a certain structure to protect the subsequently formed mask structures on the first mask film. Further, the multiple patterning method includes forming first mask structures and second mask structures by etching the second mask film, the first mask film, and the sacrificial film.

17 Claims, 5 Drawing Sheets

PATTERNED FEATURE AND MULTIPLE PATTERNING METHOD THEREOF

CROSS-REFERENCES TO RELATED APPLICATIONS

This application claims the priority of Chinese patent application No. 201410363413.6, filed on Jul. 28, 2014, the entirety of which is incorporated herein by reference.

FIELD OF THE INVENTION

The present invention generally relates to the field of semiconductor manufacturing technology and, more particularly, relates to patterned features and multiple patterning processes thereof.

BACKGROUND

With the continuous development of semiconductor technology, the technical node of semiconductor devices has become smaller and smaller. However, due to the resolution limitation of the existing photolithography processes, the features formed by the existing photolithography processes are unable to match the requirements for continuously reducing the critical dimension (CD) of the semiconductor devices. Therefore, further development of the semiconductor technology may be restrained.

In order to further reduce the CD of the semiconductor devices based on the existing photolithography process, various double patterning processes have been developed. Amongst of the double patterning processes, the Self-Aligned Double Patterning (SADP) process has been widely used because the SADP process is relatively simple.

Figure 1:
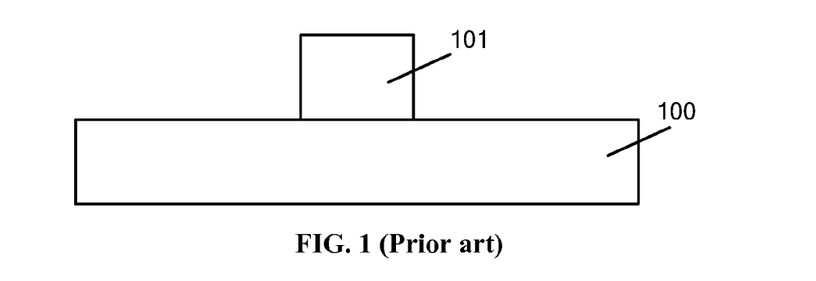
FIGS. 1~3 illustrate structures corresponding to certain stages of an existing double patterning process.
Figure 2:
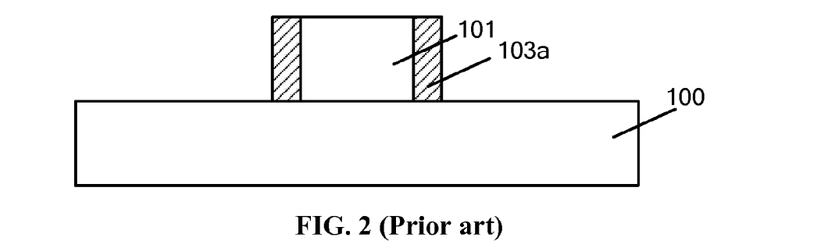
Figure 3:
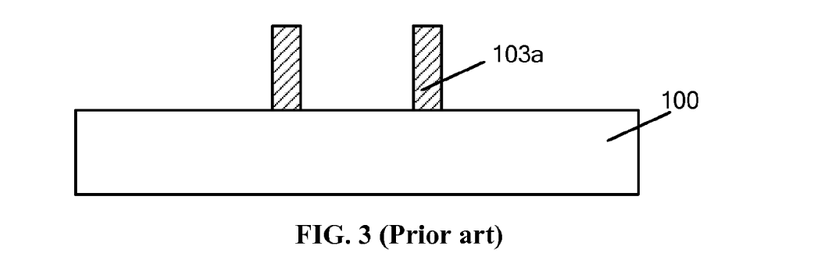

FIGS. 1~3 illustrate structures corresponding to certain stages of an existing double patterning process. As shown in FIG. 1, the process includes providing a substrate 100. The substrate 100 is subsequently etched to form desired features. A sacrificial layer 101 is formed on the surface of the substrate 100. The sacrificial layer 101 is formed by a photolithography process.

Further, as shown in FIG. 2, sidewalls 103a are formed on the surface of the substrate 100 at both sides of the sacrificial layer 101. That is, the sidewalls 103 are formed on the side surfaces of the sacrificial layer 101.

Further, as shown in FIG. 3, after forming the sidewalls 103a, the sacrificial layer 101 is removed. Thus, the independent sidewalls 103a are formed.

Further, after removing the sacrificial layer 101, the substrate 100 is etched using the independent sidewalls 103a as an etching mask. Thus, patterned features are formed on substrate 100; and such a process is referred as a double patterning process.

However, the morphology of the sidewalls 103a may be unable to match the desired requirements. Thus, the morphology of the patterned features formed by using the sidewalls 103a as an etching mask may also be unable to match the desired requirements. The disclosed device structures and methods are directed to solve one or more problems set forth above and other problems.

BRIEF SUMMARY OF THE DISCLOSURE

One aspect of the present disclosure includes a multiple patterning method for fabricating a plurality of patterned features. The multiple patterning method includes providing a substrate having a first region and a second region; forming a sacrificial film on a surface of the substrate; forming a first mask film on a surface of the sacrificial film; and forming a second mask film on a surface of the first mask film for subsequently form a certain mask layer to protect the subsequently formed mask structures. The multiple patterning method also includes forming a plurality of first mask structures in the first region; and a plurality of second mask structures protected by the certain mask layer in the second region by etching the second mask film, the first mask film, and the sacrificial film until the surface of the substrate is exposed.

Another aspect of the present disclosure includes a semiconductor structure having a plurality of patterned features. The semiconductor structure includes a substrate having a first region and a second region. The semiconductor structure also includes a plurality of first patterned features with a first critical dimension formed on the substrate in the first region. Further, the semiconductor structure includes a plurality of second patterned features with a second critical dimension formed on the substrate in the second region. Wherein the first critical dimension is smaller than the second critical dimension; and the first patterned features and the second patterned features are formed by sequentially forming a sacrificial film on a surface of the substrate; forming a first mask film on a surface of the sacrificial film; forming a second mask film for subsequently forming a certain protective layer on a surface of the first mask.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In order to match the complexity of the semiconductor fabrication process, features with different sizes may be formed in different regions of a substrate. Thus, besides sidewalls 103a illustrated in FIG. 3, sidewalls with larger sizes may also need to be formed. Forming sidewalls with different sizes on the substrate simultaneously may cause the morphology of the sidewalls not to match the desired requirements. The sidewalls may be subsequently used as an etching mask of a multiple patterning process. Thus, the features formed by using such sidewalls may be also unable to match the desired requirements.

Figure 4:
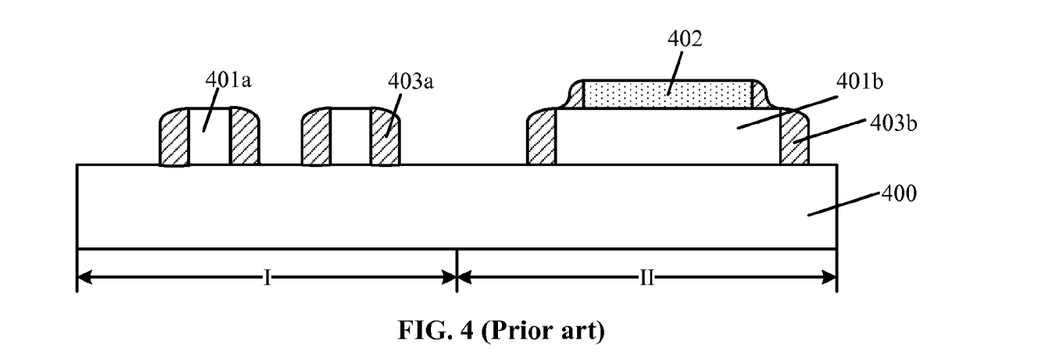
FIG. 4 illustrates a structure having a plurality of patterned features with different critical dimensions fabricated by an existing double patterning method.

FIG. 4 illustrates a structure having a plurality of patterned features with different sizes formed on a substrate. As shown in FIG. 4, a process for forming the features with different sizes may include providing a substrate 400 having a first region I and a second region II. Features with different sizes may be formed on the surface of the substrate 400 by subsequently etching the substrate 400. The process may also include forming a sacrificial film (not labeled) on the surface of the substrate 400; and forming a mask film (not shown) on the sacrificial film.

Further, the process may include etching portions of the mask film and the sacrificial film until the surface of the substrate 400 is exposed to form a first sacrificial layer 401a on the surface of the substrate 400 in the first region I; and forming a first mask layer (not shown) on the surface of the first sacrificial layer 401a. A second sacrificial layer 401b may be formed on the surface of the substrate 400 in the second region II; and a second mask layer 402 may be formed on the second sacrificial layer 401b by the same process for forming the first sacrificial layer 401a. The size of the first sacrificial layer 401a and the size of the first mask layer may be smaller than the size of the second sacrificial layer 401b and the size of the second mask layer 402.

Further, the process may also include removing the first mask layer by an etching process; and forming a sidewall film on the surfaces of the substrate 400, the first sacrificial layer 401a, the second sacrificial layer 401b, and the second mask layer 402. Further, the process may also include performing an etch back process on the sidewall film until the surface of the substrate 400 is exposed to form first sidewalls 403a on the side surfaces of the first sacrificial layer 401a, and second sidewalls 403b on the side surfaces of the second sacrificial layer 401b and the second mask layer 402. After removing the first sacrificial layer 401a, the first sidewalls 403a and the second sidewalls 403b and the second mask layer 402 may be used as etching masks to form patterned features with different sizes on the substrate 400.

The first mask layer may be removed by an isotropic etching process. The isotropic etching process may have a same etching rate on both the direction perpendicular to the surface of the substrate 400 and the direction parallel to the surface of the substrate 400. Further, the first mask layer and the second mask layer 402 may be made of a same material. Therefore, the process for removing the first mask layer may reduce the thickness of the second mask layer 402. Further, the size of the projection view of the second mask layer 402 on the surface of the substrate 400 may also be reduced.

Further, referring to FIG. 4, the second sidewalls 403b may include a first part of sidewall (not labeled) formed the on the side surfaces of the second mask layer 402, and a second part of sidewall (not labeled) formed on the side surfaces of the second sacrificial layer 401b. When the second mask layer 402 is substantially small, it may cause the surface of the connection portion between the first part of sidewall and the second part of the sidewall to have a stepping slope. Thus, the second sidewalls 403b may have an un-desired morphology. When the second the sidewalls 403b are used as an etching mask to form features on the substrate 400, the side surfaces of the features may also have an undesired morphology.

Further, the projection view of the second mask layer 402 on the surface of the substrate 200 may be smaller than the size of the second sacrificial layer 401b. When the size of the second mask layer 402 is substantially small, it may be easy to cause the first part of sidewall to break from the second part of sidewall. Therefore, a portion of the top surface of the second sacrificial layer 401b may be exposed. When the first sacrificial layer 401a is removed, the exposed portion of the second sacrificial layer 401b may be damaged. When the second sidewalls 403b and the second mask layer 402 are used as an etching mask to etching the substrate 400, the side surfaces of the formed features may also have an undesired morphology.

Figure 15:
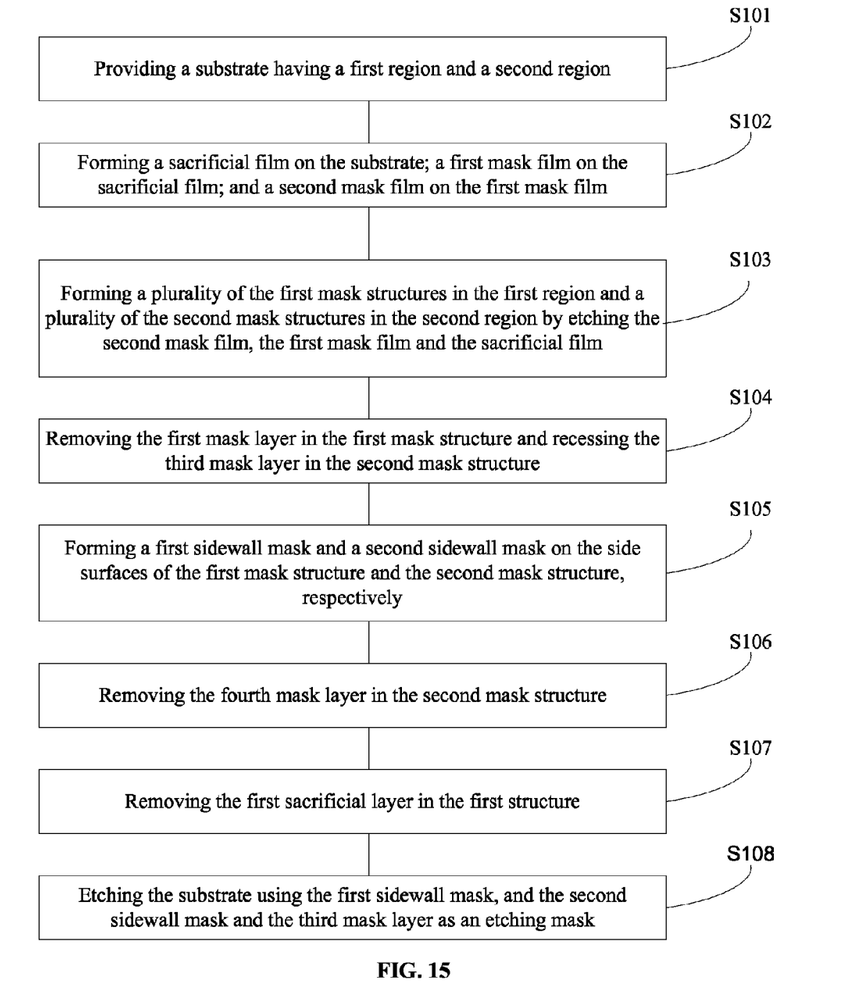
FIG. 15 illustrates an exemplary multiple patterning process of a semiconductor structure having a plurality of patterned features consistent with the disclosed embodiments.

FIG. 15 illustrates an exemplary multiple patterning process of a semiconductor structure having a plurality of patterned features consistent with the disclosed embodiments; and FIGS. 5~12 illustrate semiconductor structures corresponding certain stages of the exemplary multiple patterning process.

Figure 5:
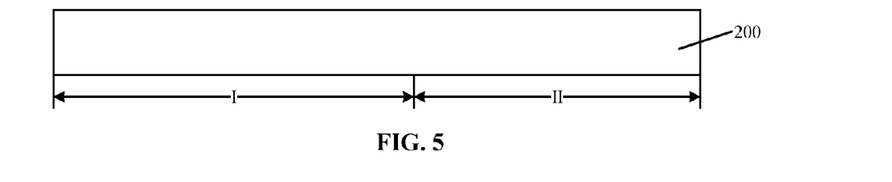
FIGS. 5~12 illustrate semiconductor structures corresponding to certain stages of an exemplary multiple patterning process of a semiconductor having a plurality of patterned features consistent with the disclosed embodiments.

As shown in FIG. 15, at the beginning of the multiple patterning process, a substrate with certain structures is provided (S101). FIG. 5 illustrates a corresponding semiconductor structure.

As shown in FIG. 5, a substrate 200 is provided. The substrate 200 may have a first region I and a second region II. A first sidewall mask, a second sidewall mask, and a second sacrificial layer may be subsequently formed on the surface of the substrate 200. Patterned features may be subsequently formed on the substrate 200 by etching the substrate 200 using the first sidewall mask, the second sidewall mask, and the third mask layer as an etching mask.

In one embodiment, the first region I may be a high device density region. A first sidewall mask with relatively small critical dimension (CD) may be subsequently formed on the surface of the substrate 200 in the first region I. Openings formed by subsequently etching the substrate 200 in the first region I may have a relatively small CD and interval. Thus, the first region I may also be referred as a narrow CD region. The second region II may be a low device density region. A second sidewall mask with a relatively large CD may be subsequently formed on the surface of the substrate 200 in the second region II. The openings formed by subsequently etching the substrate 200 in the second region II using the second sidewall mask and a third mask layer as an etching mask may have a relatively large CD. Thus, the second region may also be referred as a wide CD region.

The substrate 200 may be a bulk substrate. The substrate 200 may also be a semiconductor substrate having a to-be-etched layer formed on the semiconductor substrate. As used herein, the to-be-etched layer may refer to the layer for subsequently forming patterned features by an etching process.

In one embodiment, the substrate 200 includes a semiconductor substrate (not labeled) and a to-be-etched layer (not shown) formed on the substrate 200. The semiconductor substrate may include any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. The semiconductor substrate provides a base for subsequent devices and processes.

The to-be-etched layer may include one or more of semiconductor material, metal material, and dielectric material, etc. The metal material may include Cu, W, Al, Ti, Ta, TiN, or TaN, etc. The dielectric material may include SiO, SiN, SiON, amorphous carbon, low dielectric constant (low-K) material, or ultra-low-K material, etc. The semiconductor material may include Si, Ge, SiGe, or SiC, etc.

Further, a device layer may be formed between the semiconductor substrate and the to-be-etched layer. The device layer may include device structures, interconnect structures for electrically connecting the devices structures with the semiconductor substrate, and/or dielectric layer for electrically insulating the device structures and the interconnect structures.

The device structures may include the gate electrodes of transistors, resistors, capacitors, inductors, date storage units, fuse structures, or imaging sensors, etc. The device structures and the interconnect structures may form the chip circuits.

The dielectric layer may cover the device structures and the interconnect structures; and electrically insulated the devices structures and the interconnect structures. The dielectric layer may be made of any appropriate material, such as one or more of $SiO_2$, SiN, SiON, low-K material, or ultra-low-K material, etc.

In certain other embodiments, the substrate 200 is a semiconductor substrate. The semiconductor substrate may include any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor, or a combination thereof.

Figure 6:
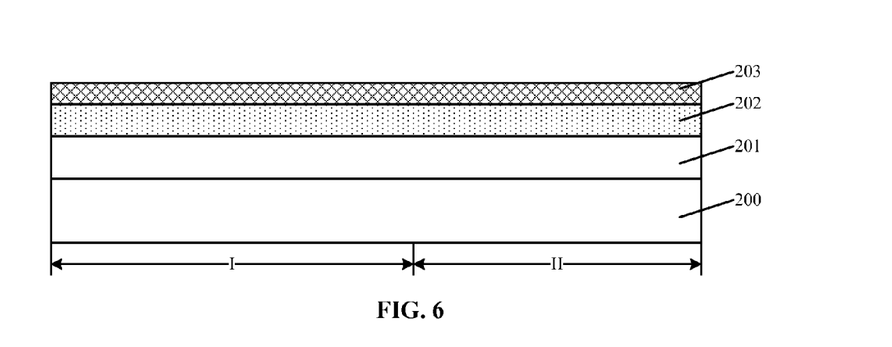

Returning to FIG. 15, after providing the substrate 200, a sacrificial film, a first mask film, and a second mask film may be formed (S102). FIG. 6 illustrates a corresponding semiconductor structure.

As shown in FIG. 6, a sacrificial film 201 is formed on the surface of the substrate 200. A first mask film 202 is formed on the surface of the sacrificial film 201. A second mask film 203 is formed on the surface of the first mask film 202.

The sacrificial film 201 may be used to subsequently form a first sacrificial layer in the first region I, and a second sacrificial layer in the second region II. The first sacrificial layer formed in the first region I may define the position of the subsequently formed first sidewall mask. The size and interval of the first sidewall mask may break the limitation of the photolithography process; and the size and the interval of the first sidewall mask may be substantially small.

The first mask film 202 may be used to subsequently form a first mask layer in the first region I, and a third mask layer in the second region II. The third mask layer formed in the second region II may prevent the second sacrificial layer from being removed during the subsequent process for removing the first sacrificial layer. The second sacrificial layer and the subsequently formed second sidewall mask may together be used as an etching mask to etch the substrate 200 in the second region II. Thus, the patterned features formed in the second region II by using such an etching mask may have a relative large CD (or wide CD).

The second mask film 203 may be used to subsequently form a second mask layer in the first region I, and a fourth mask layer in the second region II. The fourth mask layer may be able to protect the third mask layer from being over-thinned during a subsequent process for removing the first mask layer in the first region I. Thus, it may ensure that the second sidewall mask subsequently formed on the side surfaces of the third mask layer and the second sacrificial layer to have a desired morphology.

The substrate 200, the sacrificial film 201, the first mask film 202, and the second mask film 203 may have an etching selectivity. In one embodiment, the substrate 200, the sacrificial film 201, the first mask film 202, and the second mask film 203 may be made of different materials. Further, the etching selective ratio of the first mask film 202 to the second mask film 203, or to the substrate 200 may equal to or greater than two.

The sacrificial film 201, the first mask film 202, and the second mask film 203 may be made of any appropriate material. When the sacrificial film 201, the first mask film 202, and the second mask film 203 are formed in the front end of line (FEOL) processes, the sacrificial film 201 may be made of back anti-reflection coating (BARC), carbon, or Si, etc. The first mask film 202 may be made of $SiO_2$, SiN, SiON, SiC, SiG, Si, or amorphous carbon, etc. The second mask film 203 may be made of $SiO_2$, SiN, SiON, SiC, SiG, Si, or amorphous carbon, etc. The BARC may include organic BARC, or inorganic BARC, etc. The inorganic BARC may include SiN, or SiON, etc. Thus, in certain other embodiments, the first mask film 202 may be referred as a first hard mask layer; and the second mask film 203 may be referred as a second hard mask layer.

When the sacrificial film 201, the first mask film 202, and the second mask film 203 are formed in the back end of line (FEOL) processes, the sacrificial film 201 may be made of back anti-reflection coating (BARC), carbon, Si, metal, or metal nitride, etc. The first mask film 202 may be made of $SiO_2$, SiN, SiON, SiC, SiG, Si, amorphous carbon, metal, or metal nitride, etc. The second mask film 203 may be made of $SiO_2$, SiN, SiON, SiC, SiG, Si, amorphous carbon, metal, or metal nitride, etc. The metal or metal nitride may include Ti, Ta, TiN, or TaN, etc. Various processes may be used to form the sacrificial film 201, the first mask film 202, and the second mask film 203, such as a chemical vapor deposition (CVD) process, a physical vapor deposition (PVD) process, an atomic layer deposition (ALD) process, or a flowable CVD (FCVD) process, etc.

The sacrificial film 201 may be used to subsequently form a first sacrificial layer. The thickness of the first sacrificial layer may determine the height of the subsequently formed first sidewall mask. The height of the subsequently formed first sidewall mask may affect the surface morphology of the subsequently formed features. Therefore, the sacrificial film 201 may have a significantly large thickness. The significantly large thickness may ensure that the subsequently formed first sidewall mask may not be entirely removed during the etching processes for forming the features.

The first mask film 202 may be used to subsequently form a third mask layer in the second region II to protect the second sacrificial layer. The protection may prevent the subsequently formed second sacrificial layer from being removed during the process for removing the first sacrificial layer. Further, a second sidewall mask may be formed on the side surfaces of the subsequently formed second sacrificial layer and the subsequently formed third mask layer. In order to ensure the subsequently formed second sidewall mask to have a desired surface morphology, the third mask film may be relatively thick. Therefore, the thickness of the first mask film 202 may be smaller than, or equal to the thickness of the sacrificial film 201; and greater than or equal to one half of the thickness of the sacrificial film 201.

The second mask film 203 may be used to subsequently form a fourth mask layer on the surface of the third mask layer. The fourth mask layer may be used to protect the third mask layer from being excessively thinned when the first mask layer in the first region I is removed. Such a protection may ensure the subsequently formed second sidewall mask to have a desired morphology. Therefore, the second mask film 203 may not be significantly thick as long as the subsequently formed fourth mask layer is able to protect the third mask layer.

In one embodiment, the thickness of the sacrificial film 201 may be in a range of approximately 1000 Å~2000 Å. The thickness of the first mask film 202 may be in a range of approximately 800 Å~1500 Å. The thickness of the second mask film 203 may be in a range of approximately 500 Å~1000 Å.

Figure 7:
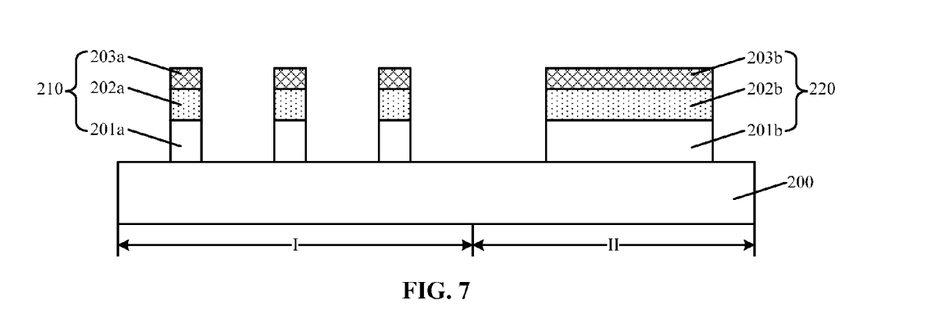

Returning to FIG. 15, after forming the sacrificial film 201, the first mask film 202, and the second mask film 203, a plurality of first mask structures and a plurality of second mask structures may be formed (S103). FIG. 7 illustrates a corresponding semiconductor structure.

As shown in FIG. 7, a plurality of first mask structures 210 are formed on the surface of the substrate 200 in the first region I. Further, a plurality of second mask structures 220 are formed on the surface of the substrate 200 in the second region II. For illustrative purposes, one second mask structure 220 is shown in FIG. 7.

The first mask structures 210 and the second mask structure 220 may be formed by etching the sacrificial film 201, the first mask film 202, and the second mask film 203 until the surface of the substrate 200 is exposed. Each of the first mask structure 210 may include a first sacrificial layer 201*a* formed on the surface of the substrate 200, a first mask layer 202*a* formed on the first sacrificial layer 201*a*, and a second mask layer 203*a* formed on the first mask layer 202*a*. The first sacrificial layer 201*a* may be formed by etching the sacrificial film 201 in the first region I. The first mask layer 202*a* may be formed by etching the first mask film 202 in the first region I. The second mask layer 202*a* may be formed by etching the second mask film 202 in the first region I.

Further, the second mask structure 220 may include a second sacrificial layer 201*b* formed on the surface of the substrate 200 in the second region II, a third mask layer 202*b* formed on the second sacrificial layer 201*b*, and a fourth mask layer 203*b* formed on the third mask layer 202*b*. The second sacrificial layer 201*b* may be formed by etching the sacrificial film 201 in the second region II. The third mask layer 202*b* may be formed by etching the first mask film 202 in the second region II. The fourth mask layer 203*b* may be formed by the etching the second mask film 203 in the second region II.

Further, referring to FIG. 7, the projection view of the first mask structure 210 on the surface of the substrate 200 may have a first size. The first size may be referred as a first CD. The projection view of the second mask structure 220 on the substrate of the substrate 200 may have a second size. The second size may be referred as a second CD. In one embodiment, the second CD is greater than the first CD.

A process for forming the first mask structure 210 and the second mask structure 220 may include forming a patterned layer (not shown) on the surface of the second mask film 203. The patterned layer may expose a portion of the surface of the second mask film 203. Further, the patterned layer may cover the regions of the second mask film 203 corresponding to the first mask structure 210, and the second mask structure 220. The process may also include etching the second mask film 203, the first mask film 202, and the sacrificial film 201 until the surface of the substrate 200 is exposed. Thus, the first mask structure 210 and the second mask structure 220 may be formed.

The patterned layer may be made of any appropriate material. In one embodiment, the patterned layer is a patterned photoresist layer. The patterned photoresist layer may be formed by spin-coating, or spraying a photoresist layer on the surface of the second mask film 203; and followed by exposing and developing the photoresist layer. After forming the first mask structure 210 and the second mask structure 220, the patterned layer may be removed by a dry etching process, a wet etching process, or a plasma ashing process, etc.

The size of patterns formed in the photoresist layer may be limited by the resolution of the photolithography process. Thus, the size of the patterns formed in the photoresist layer may have a minimum threshold value. That is, the size of the patterns on the photoresist layer may not be further reduced by a conventional photolithography process if the pattern size is smaller than the threshold value. The size and interval of the devices in the high density device region of the substrate 200 may be smaller than the minimum threshold value. Thus, after forming the first sacrificial layer 201*a* in the first region I, a sidewall mask with smaller CD may need to be formed on the side surfaces of the first sacrificial layer 201*a*. Patterned features (semiconductor structures) with a substantially small CD may be formed by etching the substrate 200 using the first sidewall mask as an etching mask. Such a process may be referred as a multiple patterning process.

The second region II of the substrate 200 may be a low device density region. The devices formed in the second region II may have a relative large CD. Thus, the projection view of the second mask structure 220 formed in the second region on the surface of the substrate 200 may be relatively large. That is, the size of the third mask layer 202*b* formed by etching the first mask film 202 may be relatively large. Further, the third mask layer 202*b* may be formed on the surface of the second sacrificial layer 202*b*, which is formed by etching the sacrificial film 201. Thus, the third mask layer 202*b* may protect the second sacrificial layer 201*b* from being removed when the first sacrificial layer 201*a* is removed. Therefore, the third mask layer 202*b*, the second sacrificial layer 201*b* and the subsequently formed second sidewall mask may together be used as an etching mask to form patterned features on the substrate 200 in the second region II. The patterned features may have a relatively large CD.

In one embodiment, the projection view of the first mask structure 210 on the surface of the substrate 200 may have a first size. That is, the first mask structure may have a first CD. The projection view of the second mask structure 220 on the surface of the substrate 200 may have a second size. That is, the second mask structure 220 may have a second CD. In certain other embodiments, the first CD may be referred as a narrow CD; and the second CD may be referred as a wide CD. The second CD may be approximately equal to, or greater than three times of the first CD. That is, the lateral size of the third mask layer 202*b* may be approximately three times of the lateral size of the first mask layer 202*a*. When the first mask layer 202*a* is subsequently removed, the third mask layer 202*b* may not be removed. Thus, the third mask layer 202*b* may be still on the second sacrificial layer 201*b* to protect the second sacrificial layer 201*b*.

However, before subsequently removing the first sacrificial layer 201*a*, the first mask layer 202*a* formed on first sacrificial layer 201*a* may need to be removed first. The first mask layer 202*a* in the first region and the third mask layer 202*b* in the second region II may be both formed by etching the first mask film 202. Thus, when the first sacrificial layer 201*a* is being removed, the third mask layer 202*b* may be damaged; and the thickness of the third mask layer 202*b* may be reduced. If the thickness of the third mask layer 202*b* is substantially small, it may be easy to cause the second sidewall mask subsequently formed on the side surfaces of the third mask layer 202*b* and the second sacrificial layer 201b to have an un-desired morphology. Thus, it may need to form the fourth mask layer 203b on the surface of the third mask layer 202b to protect the third mask layer 202b. The fourth mask layer 203b may prevent the third mask layer 202b from being thinned during the subsequent process for removing the first sacrificial layer 201a. Thus, the subsequently formed second sidewall mask may have a desired morphology.

The second mask film 203, the first mask film 202, and the sacrificial film 201 may be etched by any appropriate process, such as a dry etching process, a wet etching process, or an ion beam etching process, etc. In one embodiment, an anisotropic dry etching process is used to etch the second mask film 203, the first mask film 202 and the sacrificial film 201. The etching direction may be perpendicular to the surface of the substrate 200. Thus, the projection view of the first mask structure 210 and the second mask structure 220 on the surface of the substrate 200 may be identical to the patterned layer.

Figure 8:
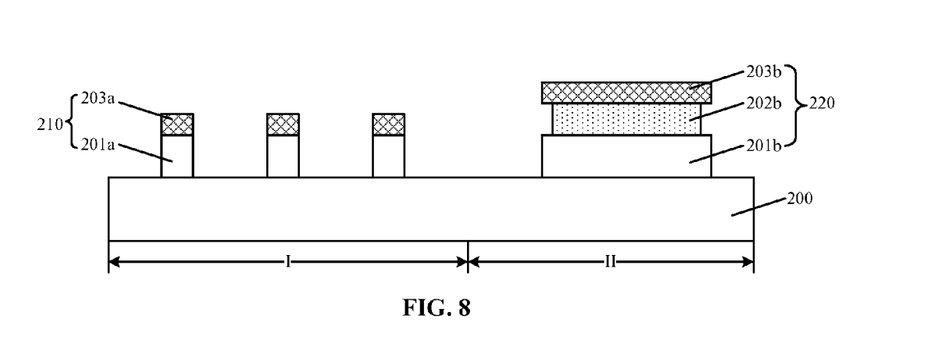

Returning to FIG. 15, after forming the first mask structure 210 and the second mask structure 220, the first mask layer 220a may be removed (S104). FIG. 8 illustrates a corresponding semiconductor structure.

As shown in FIG. 8, the first mask layer 202a of each of the first mask structure 210 is removed; and the second mask layer 203a may fall down on the surface of the first sacrificial layer 201a. Further, the third mask layer 202b may be recessed. That is, the lateral CD of the third mask layer 202b may be reduced.

As described above, the first mask film 202 may be etched to form the first mask layer 202a in the first region I; and the third mask layer 203b in the second region II. The third mask layer 202b may be used to protect the second sacrificial layer 201b during the subsequent process for removing the first sacrificial layer 201a. Further, the third mask layer 202b and the subsequently formed second sidewall mask may together be used as an etching mask to etching the substrate 200 in the second region II. Thus, the third mask layer 202b may be necessary to keep.

At the same time, a first sidewall mask may be subsequently formed on the side surfaces of the first sacrificial layer 201a. The height of the subsequently formed first sidewall mask may be determined by at least the thickness of the first sacrificial layer 201a. If the first sidewall mask is significantly high, the first sidewall mask may easily collapse when the first sidewall mask is used as an etching mask for subsequently etching the substrate 200.

Further, in order to ensure the second sidewall mask subsequently formed in the second region II to have a desired morphology, the first mask layer 202a and the third mask layer 202b may be relatively thick. Therefore, it may need to remove the first mask layer 202a to avoid possible collapsing caused by a significantly large height. That is, if the first mask layer 202a is not removed, the first sidewall mask may be subsequently formed on both the side surfaces of the first sacrificial layer 201a and the side surfaces of the first mask layer 202a. The height of such a first sidewall mask is greater than the height of the first sidewall mask only formed on the side surfaces of the first sacrificial layer 201a. Thus, the first sidewall mask may easily collapse.

Various processes may be used to remove the first mask layer 202a, such as a dry etching process, or a wet etching process, etc. In one embodiment, the first mask layer 202a is removed by an isotropic etching process. The isotropic etching process may have a same etching rate along both the direction parallel to the surface of the substrate 200 and the direction perpendicular to the surface of the substrate 200.

Thus, the isotropic etching process may be able to etch the side surfaces of the first mask layer 202a and the third mask layer 202b. The isotropic etching process may be performed until the first mask layer 202a is completely removed.

In one embodiment, an isotropic dry etching process is used to etch the first mask layer 202a and the third mask layer 202b. Referring to FIG. 8, after removing first mask layer 202a, the second mask layer 203a may fall down on the surface of the first sacrificial layer 201a. When the fourth mask layer 203b is subsequently removed, the second mask layer 203a may be removed simultaneously.

In one embodiment, the isotropic dry etching process is a plasma etching process. The pressure of the plasma etching process may be in a range of approximately 0~50 mTorr. The bias voltage of the plasma etching process may be in a range of approximately 0~100 V. The total flow rate of the etching gas may be in a range of approximately 100 sccm~500 sccm.

When the first mask layer 202a and the third mask layer 202b are made of polysilicon, the etching gas of the plasma etching process may include HBr, and $O_2$, etc. The volume ratio of HBr and $O_2$ may be in a range of approximately 1:1~30:1.

When the first mask layer 202a and the third mask layer 202b are made of silicon oxide, the etching gas of the plasma etching process may include $C_4F_6$, and He, etc. The volume ratio of $C_4F_6$ and He may be in a range of approximately 1:1~40:1.

When the first mask layer 202a and the third mask layer 202b are made of silicon nitride, the etching gas of the plasma etching process may include $CH_3F$, and He, etc. The volume ratio of $CH_3F$ and He may be in a range of approximately 1:1~40:1.

In certain other embodiments, the isotropic etching process is an isotropic wet etching process. When the first mask layer 202a is removed, the second mask layer 203a may also be removed. Thus, it may only need to subsequently remove the fourth mask layer 203b.

The first mask layer 202a and the third mask layer 202b may be made of a same material. Thus, the isotropic etching process may etch the first mask layer 202a and the third mask layer 202b simultaneously. When the first mask layer 202a is entirely removed, the etching amount of the isotropic etching process may be one half of the first CD of the first mask structure 210. That is, the lateral size of the sidewall of the third mask layer 202b removed by the isotropic etching process may be approximately one half of the first CD.

In certain other embodiments, the etch amount (the recessed size) of the third mask layer 202b may be two third of the first CD. In certain other embodiments, the etch amount (the recessed size) of the third mask layer 202b may be three fourth of the first CD.

A second sidewall mask may be subsequently formed on the side surfaces of the third mask layer 202b. Thus, it may need to remove the residual by-products left on the side surfaces of the third mask layer 202b by the isotropic etching process. Further, it may also need to ensure the first mask layer 202a to be entirely removed. Therefore, the third mask layer 202b may be over etched after removing the first mask layer 202a. The etched amount of the over etching process may be approximately of one tenth of the first CD of the first mask structure 210.

Figure 9:
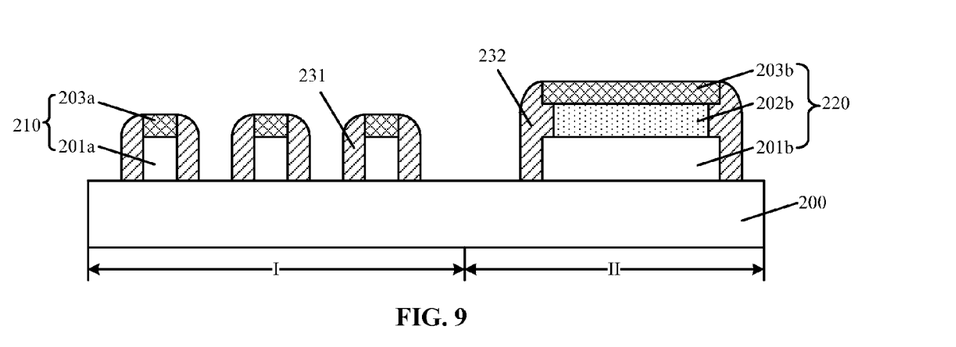

Returning to FIG. 15, after removing the first mask layer 202a, a first sidewall mask and a second sidewall mask may be formed (S105). FIG. 9 illustrates a corresponding semiconductor structure.

As shown in FIG. 9, a first sidewall mask 231 is formed on the side surfaces of the first sacrificial layer 201a. Further, a second sidewall mask 232 is formed on the side surfaces of the second sacrificial layer 201b and the third mask layer 202b. As used herein, the sidewall mask may refer that the sidewall spacers formed on the side surfaces of the first sacrificial layer 201a, the second sacrificial layer 201b and the third mask layer 202b may be subsequently used as an etching mask to etch the substrate 200. The first sidewall mask 231 may include a plurality of the first sidewall spacers (not labeled); and the second sidewall mask 232 may include a plurality of second sidewall spacers (not labeled)

Further, referring to FIG. 9, in one embodiment, the second mask layer 203a may fall down on the surface of the first sacrificial layer 201a after removing the first mask layer 202a. Thus, the first sidewall mask 231 may also be formed on the side surfaces of the second mask layer 203a. Before subsequently removing the first sacrificial layer 201a, the second mask layer 203a may be removed. The second mask layer 203a and the fourth mask layer 203b may be formed by etching the second mask film 203. Further, the fourth mask layer 203b may be relatively thin. Thus, although the height of the first sidewall mask 231 may be determined by the total thickness of the first sacrificial layer 201a and the second mask layer 203a, the height of the first sidewall mask 231 may not be significantly large. During a subsequent process for etching the substrate 200, the first sidewall mask 231 may not easily collapse. Further, the height of the first sidewall mask 231 may not be substantially small, during a subsequent process for etching the substrate 200, the first sidewall mask 231 may not be entirely removed.

Further, referring to FIG. 9, in the second region II, the second sidewall mask 232 and the third mask layer 202b may together be used as an etching mask for subsequently etching the substrate 200. Thus, the patterned features subsequently formed on the substrate 200 in the second region may have a relatively large CD. The third mask layer 202b may be able to protect the second sacrificial layer 201b from being removed during a subsequent process for removing the first sacrificial layer 201a.

A process for forming the first sidewall mask 231 and the second sidewall mask 232 may include forming a sidewall film on the surface of the substrate 200, the side surfaces and the top surfaces of the first mask structure 210, and the side surfaces and the top surfaces of the second mask structures 220; and followed by performing an etch-back process on the sidewall film until the surface of the substrate 200 and the surface of the fourth mask layer 203b are exposed. Thus, the first sidewall mask 231, and the second sidewall mask 232 may be formed.

Referring to FIG. 9, in one embodiment, the second mask layer 203a may be left on the surface of the first sacrificial layer 201a. Thus, the etch-back process may also expose the surface of the second mask layer 203a. In certain other embodiments, the second mask layer 203a may be removed by a previous wet etching process. Thus, the etch-back process may expose the surface of the first sacrificial layer 201a.

The sidewall film may be made of any appropriate material, such as one or more of $SiNO_2$, SiN, SiON, SiC, SiGe, Si, Ge, or amorphous carbon, etc. Various processes may be used to form the sidewall film, such as a CVD process, a PVD process, an ALD process, or an FCVD process, etc. The thickness of the sidewall film may determine the thickness of the first sidewall mask 231 and the thickness of the second sidewall mask 232. Further, the thickness of the first sidewall mask may determine the CD of the subsequently formed features in the first region I.

The first sidewall mask 231 and the second sidewall mask 232 may have an etching selectivity to the substrate 200 or the first sacrificial layer 201a. The etching selectivity may ensure the first sidewall mask 231 and the second sidewall mask 232 not to be damaged during the subsequent process for removing the first sacrificial layer 201a. Further, the etching selectivity may cause the first sidewall mask 231 and the second sidewall mask 232 to be used as an etching mask to etch the substrate 200. In one embodiment, the first sidewall mask 231 and the second sidewall mask 232 are made of a material different from the substrate 200 or the first sacrificial layer 201a.

In one embodiment, the first sidewall mask 231 and the second sidewall mask 232 may be made of a material as same as the fourth mask layer 203b, or different from the fourth mask layer 203b. When the first sidewall mask 231 and the second sidewall mask 232 are made of a material different from the from the fourth mask layer 203b, the etch-back process may stop on the surface of the fourth mask layer 203b. When the first sidewall mask 231 and the second sidewall mask 232 are made of a material as same as the fourth mask layer 203b, the etch-back process may remove the second mask layer 203a and the fourth mask layer 203b simultaneously. Thus, the first sacrificial layer 201a and the third mask layer 203b may be exposed.

In one embodiment, the third mask layer 202b is made a material different from the first sidewall mask 231 and the second sidewall mask 232. Thus, the third mask layer 202b may have an etching selectivity with the first sidewall mask 231 and the second sidewall mask 232. The etching selectivity ratio of the third mask layer 202b to the first sidewall mask 231 and the second sidewall mask 232 may be approximately greater than, or equal to two.

In one embodiment, the sidewall film is formed by an ALD process. The ALD process may have a desired surface covering ability. Referring to FIG. 8, in one embodiment, when the first mask layer 202a is being removed, the sidewall of the third mask layer 202b may be etched simultaneously. Thus, the sidewall of the third mask layer 202b may have a recess to the fourth mask layer 203b and the second sacrificial layer 201b. When the ALD process is used to form the sidewall film, the sidewall film may be able to fill the recess. Thus, it may prevent the portion of the second sidewall mask 232 formed on the side surfaces of the third mask layer 202b from being discrete from the portion of the second sidewall mask 232 formed on the side surface of the second sacrificial layer 201b. Therefore, it may ensure the second sidewall mask 232 to have a desired morphology. When the second sidewall mask 232 and the third mask layer 202b are used an etching mask to etch the substrate 200, the patterned features may have a desired morphology as well.

Figure 10:
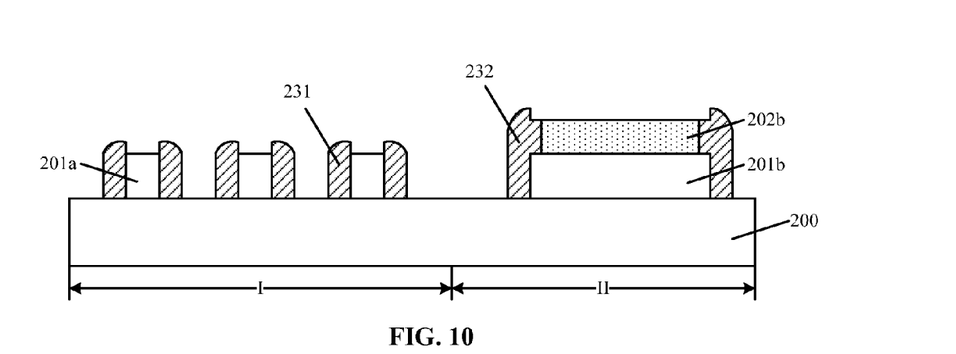

Returning to FIG. 15, after forming the first sidewall mask 231 and the second sidewall mask 232, the fourth mask layer 203b may be removed (S106). FIG. 10 illustrates a corresponding semiconductor structure.

As shown in FIG. 10, the fourth mask layer 203b is removed. The fourth mask 203b may be removed by any appropriate process, such as a dry etching process, or a wet etching process, etc. In one embodiment, the second mask layer 203a may be left on the surface of the first sacrificial layer 201a; and the second mask layer 203a and the third mask layer 203b may be made of a same material. Thus, the fourth mask layer 203b and the second mask layer 203a may be removed simultaneously.

In order to remove the by-products of the etching process for removing the fourth mask layer 203b after removing the fourth mask layer 203b, in one embodiment, the third mask layer 202b may be over-etched. The etch amount of the third mask layer 202b may be smaller than or equal to approximately one tenth of the first CD.

In certain other embodiments, referring to FIG. 7, the second mask layer 203a and the first mask layer 202a may be removed by a wet etching process simultaneously. Thus, it may only need to remove the fourth mask layer 203b.

In certain other embodiments, the fourth mask layer 203b may be kept. Thus, the fourth mask layer 203b and the second sidewall mask 232 may together to be used as an etching mask to etch the substrate 200 in the second region II.

Figure 11:
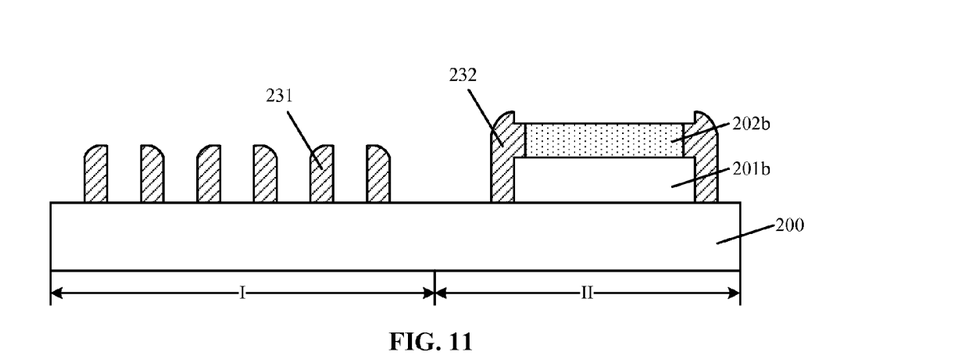

Returning to FIG. 15, after removing the fourth mask layer 203b, the first sacrificial layer 201a may be removed (S107). FIG. 11 illustrates a corresponding semiconductor structure.

As shown in FIG. 11, the first sacrificial layer 201a is removed; and the portion of the surface of the substrate 200 covered by the first sacrificial layer 201a are exposed. Thus, the first sidewall mask 231 may include a plurality of individual sidewall spacers. The CD of each of the sidewall spacers may be referred as a third CD. The CD of the patterned features subsequently formed on the substrate 200 in the first region I may be identical to the third CD.

The first sacrificial layer 201a may be removed by any appropriate processes, such as a dry etching process, or a wet etching process, etc. The dry etching process may be an isotropic dry etching process, or an anisotropic dry etching process, etc.

In one embodiment, the first sacrificial layer 201a may be removed by a wet etching process. Because the first sacrificial layer 201a may have an etching selectivity to the first sidewall mask 231, the second sidewall mask 232, the third mask layer 202b, and the substrate 200, the wet etching process for removing the first sacrificial layer 201a may cause significantly small damage to the first sidewall mask 231, the second sidewall mask 232, the third mask layer 202b, and the substrate 200. After removing the first sacrificial layer 201a, the substrate 200 in the first region I may be subsequently etched using the first sidewall mask 231 as an etch mask to form patterned features.

In the second region II of the substrate 200, although the second sacrificial layer 201b may be made of a material as same as the first sacrificial layer 201a, the second sacrificial layer 201b may not be damaged by the wet etching process because the second sacrificial layer 201b may be protected by the second sidewall mask 232 and third mask layer 202b. Further, the second sidewall mask 232 and the third mask layer 202b may be able to together be used as the etching mask for subsequently etching the substrate 200 in the second region II.

Figure 12:
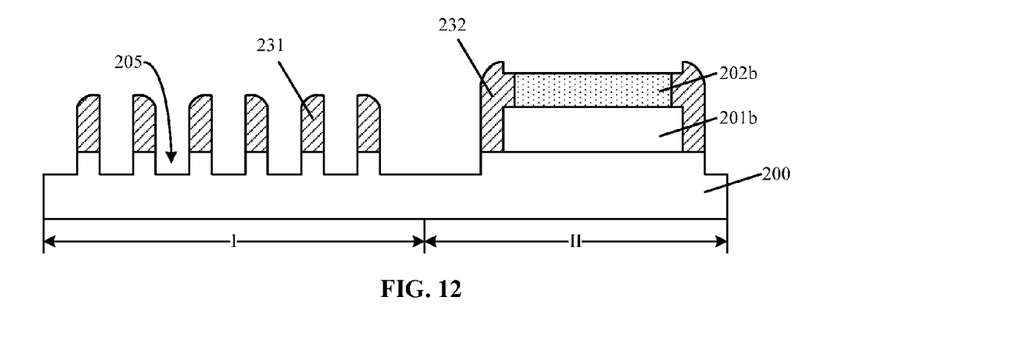

Returning to FIG. 15, after removing the first sacrificial layer 201a, patterned features may be formed (S108). FIG. 12 illustrates a corresponding semiconductor structure.

As shown in FIG. 12, patterned features (not labeled) are formed on the substrate 200. The patterned features may be formed by etching the substrate 200 using the first sidewall mask 231 and the second sidewall mask 232 and the third mask layer 202b as an etching mask. Thus, a plurality of first openings 205 may be formed on the substrate 200 in the first region I; and a second opening (not labeled) may be formed between a feature in the first region I and an adjacent feature in the second region II. If the feature in the second region II is more than one, third openings (not shown) may be formed on the second substrate 200 in the second region II.

The substrate 200 may be etched by any appropriate process, such as a dry etching process, or a wet etching process, etc. In one embodiment, an anisotropic dry etching process is used to etch the substrate 200 to form the patterned features. The etching direction may be perpendicular to the surface of the substrate 200. In the first region I, the geometry of the patterned features (or the openings 205) may be determined by the structure of the first sidewall mask 231. Thus, the CD of the patterned features in the first region I may be identical to the third CD which is the CD of the sidewall spacers of the first sidewall mask 231. In the second region II, the geometry of the patterned features may be determined by the structures of the second sidewall spacer 232 and the third mask layer 202b. Thus, the CD of the patterned features in the second region II may be identical the second CD. The parameters of the etching process for forming the patterned features may be adjusted according to the material of the substrate 200 and the designed requirements of the patterned features.

Optionally and additionally, after forming the patterned features on the substrate 200, the first sidewall mask 231, the second sidewall mask 232, the third mask layer 202b and the second sacrificial layer 201b may be removed. The first sidewall mask 231, the second sidewall mask 232, the third mask layer 202b and the second sacrificial layer 201b may be removed by any appropriate process, such as one or more of a dry etching process, or a wet etching process, etc.

Figure 13:
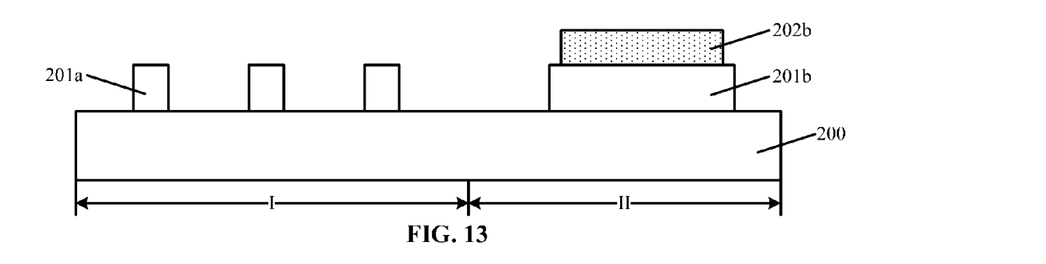
FIGS. 13~14 illustrate semiconductor structures corresponding to certain stages of another exemplary multiple patterning process of a semiconductor structure having a plurality of patterned features consistent with the disclosed embodiments.

In certain other embodiments, the second mask layer 203a and the fourth mask layer 203b (shown in FIG. 8) may be removed before forming the first sidewall mask 231 and the second sidewall mask 232. FIG. 13 illustrates a corresponding semiconductor structure.

As shown in FIG. 13, the second mask layer 203a and the fourth mask layer 203b are removed after removing the first mask layer 202a (referring to FIG. 8); and before forming a first sidewall mask and a second sidewall mask.

Various processes may be used to remove the second mask layer 203a and the fourth mask layer 203b, such as a dry etching process, or a wet etching process. In one embodiment, an isotropic dry etching process is used to remove the second mask layer 203a and the fourth mask layer 203b. The isotropic dry etching process may remove the second mask layer 203a and the fourth mask layer 203b simultaneously.

In certain other embodiments, referring to FIGS. 7-8, the wet etching process for removing the first mask layer 202a may remove the second mask layer 203a simultaneously. Thus, it may only need to remove the fourth mask layer 203b to form the semiconductor structure illustrated in FIG. 13.

The fourth mask layer 203b may be removed by any appropriate process, such as a dry etching process, or a wet etching process, etc. In one embodiment, in order to remove the etching by-products formed on the surfaces of the first sacrificial layer 201a, the second sacrificial layer 201b and the third mask layer 202b, the third mask layer 202b may be over etched after removing the first mask layer 202a. The etching amount may be smaller, or equal to approximately one tenth of the first CD.

Figure 14:
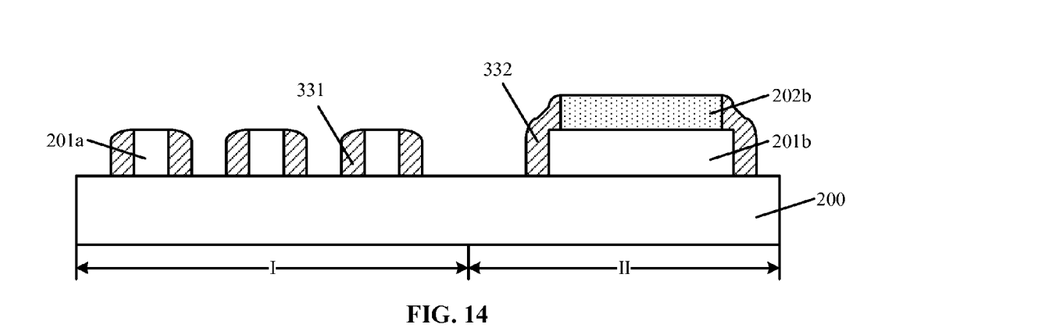

Further, as shown in FIG. 14, after removing the fourth mask layer 202b, a first sidewall mask 331 may be formed on the side surfaces of the first sacrificial layer 201a. Further, a second sidewall mask 332 may be formed on the side surfaces of the second sacrificial layer 201b and the third mask layer 202b. The first sidewall wall mask 331 and the second sidewall mask 332 may include a plurality of sidewall spacers (not labeled).

In the first region I, the first sidewall mask 331 may be used to subsequently etch the substrate 200 to formed patterned features on the substrate 200 after subsequently removing the first sacrificial layer 201a. In the second region II, the second sidewall mask 332 and the third mask layer 202b may be together used as an etching mask to etch the substrate 200 to form patterned features with a relatively large CD. The third mask layer 202b may be able to protect the second sacrificial layer 201b from being removed when the first sacrificial layer 201a is subsequently removed.

A process for forming the first sidewall mask 331 and the second sidewall mask 332 may include forming a sidewall film on the surface of the substrate 200, the side surfaces and the top surfaces of the first sacrificial layer 201a, and the side surfaces and the top surfaces of the second sacrificial layer 201b and the third mask layer 202b; and followed by performing an etch back process onto the sidewall film until the surface of the substrate 200 and the surface of the third mask layer 202b are exposed. Thus, the first sidewall mask 331 and the second sidewall mask 332 may be formed.

The sidewall film may be made of any appropriate material, such as one or more of $SiO_2$, SiN, SiON, SiC, SiGe, Si, Ge or amorphous carbon, etc. Various processes may be used to form the sidewall film, such as a CVD process, a PVD process, an ALD process, or an FCVD process, etc. The thickness of the sidewall film may determine the thickness of the first sidewall mask 331 and the thickness of the second sidewall mask 332.

The first sidewall mask 331 and the second sidewall mask 332 may have an etching selectivity to the substrate 200 or the first sacrificial layer 201a. The etching selectivity may ensure that the first sidewall mask 331 and the second sidewall mask 332 may not be damaged during the subsequent process for removing the first sacrificial layer 201a. Further, the etching selectivity may cause the first sidewall mask 331 and the second sidewall mask 332 to be used as an etching mask to etch the substrate 200. In one embodiment, the first sidewall mask 331 and the second sidewall mask 332 are made of a material different from the substrate 200 or the first sacrificial layer 201a.

In one embodiment, the third mask layer 202b is made of a material different from the first sidewall mask 331 and the second sidewall mask 332. Thus, the third mask layer 202b may have an etching selectivity with the first sidewall mask 331 and the second sidewall mask 332. Further, the etch-back process may stop at the surface of the third mask layer 202b. The etching selectivity ratio of the third mask layer 202b to the first sidewall mask 331 and the second sidewall mask 332 may be approximately greater than or equal to two.

In one embodiment, the sidewall film is formed by an ALD process. The ALD process may have a desired surface cover ability. Referring to FIG. 8, in one embodiment, when the first mask layer 202a is being removed, the sidewall of the third mask layer 202b may be etched simultaneously. Thus, as shown in FIGS. 13~14, the lateral size of the third mask layer 202b may be smaller than the second sacrificial layer 201b. When the ALD process is used to form the sidewall film, the sidewall film may be able to entirely cover the side surface of the third mask layer 202b and the second sacrificial film 201b. Thus, it may ensure the second sidewall mask 332 to have a desired morphology; and prevent the second sacrificial layer 201b from being exposed after the etch-back process.

The etch-back process may be any appropriate etching process, such as a dry etching process, or a wet etching process, etc. In one embodiment, the etch-back process is an anisotropic dry etching process. The etching direction may be perpendicular to the substrate 200. Because the third mask layer 202b may be protected by the fourth mask layer 203b before the fourth mask layer 203b is removed, the third mask layer 202b may have a desired thickness. Thus, the portion of the second sidewall mask 332 formed on the side surfaces of the third mask layer 202b and the portion of the second sidewall mask 332 formed on the side surfaces of the second sacrificial layer 201b may have a smooth transition. Therefore, the second sidewall mask 332 may have a desired surface morphology. The patterned features formed by using the second sidewall mask 332 as an etching mask may also have a desired surface morphology.

Thus, a semiconductor structure having a plurality of patterned features may be formed by the above disclosed processes and methods; and the corresponding semiconductor structure is illustrated in FIG. 12. As shown in FIG. 12, the semiconductor structure include a substrate 200 having a first region I and a second region II. The semiconductor also includes a plurality of first patterned features (not labeled) with a third critical dimension formed on the surface of the substrate 200 in the first region I. Further, the semiconductor structure includes a plurality of second patterned features (not labeled) with a second critical dimension formed on the surface of the substrate 200 in the second region II. The detailed structures and intermediate structures are described above with respect to the fabrication processes.

According to the disclosed methods and structures, after forming a sacrificial film on the surface of a substrate; and forming a first mask film on the surface of the sacrificial layer, a second mask film may be formed on the surface of the first mask layer. Then, a plurality of first mask structures and a plurality of second mask structures may be formed by etching the second mask film, the first mask film, and the first sacrificial film. The critical dimension of the first mask structures may be smaller than the critical dimension of the second mask structures. The first mask structure may include a first sacrificial layer formed on the surface of the substrate, a first mask layer formed on the first sacrificial layer, and a second mask layer formed on the surface of the first mask layer. The second mask structure may include a second sacrificial layer formed on the surface of the substrate, a third mask layer formed on the surface of the second sacrificial layer, and a fourth mask layer formed on the third mask layer.

In the first mask structure, it may need to form a first sidewall mask on the side surfaces of the first sacrificial layer. The first sidewall mask may be used as an etching mask for etching the substrate to form patterned features with relatively a small first critical dimension. Thus, it may need to remove the first mask layer to avoid the collapse of the first sidewall mask.

In the second mask structure, the third mask layer and the second sidewall mask formed on the side surfaces of the third mask layer and the second sacrificial layer may be used as an etch mask to etch the substrate to form patterned features with a relatively large second critical dimension. Because the fourth mask layer may be formed on the third mask layer, the third mask layer may not be thinned when the first mask layer is subsequently removed. Thus, the second sidewall mask may have a desired morphology; may have a smooth transition from the side surfaces of the third mask layer to the side surfaces of the second sacrificial layer.

Therefore, the patterned features formed by using the second sidewall mask and the third mask layer as an etching mask may have a desired morphology as well.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A multiple patterning method for fabricating patterned features, comprising:
    providing a substrate having a first region and a second region;
    forming a sacrificial film on a surface of the substrate;
    forming a first mask film on a surface of the sacrificial film;
    forming a second mask film on a surface of the first mask film; and
    forming a plurality of first mask structures in the first region, and a plurality of second mask structures in the second region by etching the second mask film, the first mask film, and the sacrificial film until surface portions of the substrate respectively in the first region and the second region are exposed, wherein:
    the plurality of first mask structures in the first region includes at least two first mask structures each having a first critical dimension, and
    the plurality of second mask structures in the second region includes at least one second mask structure having a second critical dimension, the first critical dimension being smaller than the second critical dimension.

2. The multiple patterning method according to claim 1, wherein:
    the first mask structure includes a first sacrificial layer, a first mask layer and a second mask layer in the first region, after the second mask film, the first mask film, and the sacrificial film in the first region are etched; and
    the second mask structure includes a second sacrificial layer, a third mask layer and a fourth mask layer, after the second mask film, the first mask film, and the sacrificial film in the second region are etched.

3. The multiple patterning method according to claim 2, after forming the plurality of first mask structures and the plurality of second mask structures, further including:
    etching the first mask layer and the third mask layer, until the first mask layer between the first sacrificial layer and the second mask layer in the first region is removed, and the third mask layer between the second sacrificial layer and the fourth mask layer in the second region has a lateral recess; and
    forming a first sidewall mask on side surfaces of the first sacrificial layer in the first region, and a second sidewall mask on side surfaces of the second sacrificial layer, the third mask layer, and the fourth mask layer in the second region.

4. The multiple patterning method according to claim 3, after forming the first sidewall mask and the second sidewall mask, further including:
    removing the fourth mask layer in the second region;
    removing the first sacrificial layer in the first region; and
    etching the substrate, using the first sidewall mask in the first region, and the second sidewall mask and the third mask layer in the second region as an etching mask.

5. The multiple patterning method according to claim 3, after etching the first mask layer and the third mask layer, further including:
    over-etching the third mask layer in the second region with a lateral etching amount less than approximately one tenth of the first critical dimension.

6. The multiple patterning method according to claim 3, wherein forming the first sidewall mask and the second sidewall mask includes:
    forming a sidewall film on the surface portions of the substrate, side and top surfaces of the second mask layer and the first sacrificial layer, and side and top surfaces of the third mask layer and the second sacrificial layer; and
    performing an etch back process on the sidewall film until a top surface of the substrate, a top surface of the second mask layer, and a top surface of the third mask layer are exposed.

7. The multiple patterning method according to claim 6, wherein:
    the sidewall film is formed by an atomic layer deposition process.

8. The multiple patterning method according to claim 3, wherein:
    an etching selectivity ratio of the first mask film to the second mask film, the substrate, the first sidewall mask or the second sidewall mask may be greater than approximately two.

9. The multiple patterning method according to claim 3, wherein:
    the second mask film is made of a material different from the first sidewall mask or the second sidewall mask.

10. The multiple patterning method according to claim 1, wherein:
    the second critical dimension is approximately equal to or greater than three times of the first critical dimension.

11. The multiple patterning method according to claim 1, wherein:
    an amount of the lateral recess is approximately greater two third of the first critical dimension.

12. The multiple patterning method according to claim 1, wherein:
    the sacrificial film is made of one of bottom anti-reflective material, amorphous carbon, and silicon;
    the first mask film is made of one of silicon oxide, silicon nitride, silicon oxynitride, silicon carbide, silicon germanium, and silicon; and
    the second mask film is made of one of silicon oxide, silicon nitride, silicon oxynitride, silicon carbide, silicon germanium, and silicon.

13. The multiple patterning method to claim 1, wherein:
    the substrate includes a semiconductor substrate, a to-be-etched layer, a device layer, electrical interconnect structures, and a dielectric layer.

14. A multiple patterning method for fabricating patterned features, comprising:
    providing a substrate having a first region and a second region;
    forming a sacrificial film on a surface of the substrate;
    forming a first mask film on a surface of the sacrificial film;
    forming a second mask film on a surface of the first mask film; and forming a plurality of first mask structures in the first region, and a plurality of second mask structures in the second region by etching the second mask film, the first mask film, and the sacrificial film, until surface portions of the substrate respectively in the first region and the second region are exposed, wherein:

each first mask structure includes a first sacrificial layer, a first mask layer and a second mask layer and each second mask structure includes a second sacrificial layer, a third mask layer, and a fourth mask layer, removing the first mask layer and the second mask layer simultaneously;

removing the fourth mask layer;

forming a first sidewall mask on side surfaces of the first sacrificial layer and a second sidewall mask on side surfaces of the third mask layer and the second sacrificial layer;

removing the first sacrificial layer; and etching the substrate using the first sidewall mask and the second sidewall mask and the third mask layer as an etching mask to form the patterned features.

15. The multiple patterning method according to claim 14, wherein:

the second mask layer and the fourth mask layer are removed simultaneously.

16. The multiple patterning method according to claim 14, wherein:

the sacrificial film is made of one of bottom anti-reflective material, amorphous carbon, and silicon;

the first mask film is made of one of silicon oxide, silicon nitride, silicon oxynitride, silicon carbide, silicon germanium, and silicon; and the second mask film is made of one of silicon oxide, silicon nitride, silicon oxynitride, silicon carbide, silicon germanium, and silicon.

17. The multiple patterning method to claim 14, wherein:

the substrate includes a semiconductor substrate, a to-be-etched layer, a device layer, electrical interconnect structures, and a dielectric layer.

\* \* \* \* \*